United States Patent [19]

Aviram et al.

[11] 3,953,874
[45] Apr. 27, 1976

[54] ORGANIC ELECTRONIC RECTIFYING DEVICES

[75] Inventors: Arieh Aviram, Yorktown Heights; Marvin Joseph Freiser, Scarborough; Philip Edward Seiden, Briarcliff Manor; William Robert Young, Millwood, all of N.Y.

[73] Assignee: International Business Machines Corporation, Armonk, N.Y.

[22] Filed: Mar. 12, 1974

[21] Appl. No.: 450,541

[52] U.S. Cl. ............................ 357/8; 252/62.3 Q; 260/396 R; 260/396 N; 260/429 J
[51] Int. Cl.² .................................. H01L 29/28
[58] Field of Search ............... 357/8; 260/396 N; 252/62.3 Q; 117/200, 218

[56] References Cited
UNITED STATES PATENTS

| | | | |
|---|---|---|---|
| 2,187,541 | 1/1940 | Goranson et al. | 357/8 |
| 3,321,681 | 5/1967 | Lauttman | 357/8 |
| 3,379,740 | 4/1968 | Matsunaga | 357/8 |
| 3,403,165 | 9/1968 | Matsunaga | 357/8 |
| 3,408,349 | 10/1968 | Matsunaga | 357/8 |
| 3,428,892 | 2/1969 | Meinhard | 357/8 |
| 3,449,329 | 6/1969 | Wildi | 357/8 |
| 3,455,971 | 7/1969 | Boyer | 260/396 N |
| 3,516,779 | 6/1970 | Koike et al. | 260/396 N |
| 3,789,216 | 1/1974 | Komp | 357/8 |
| 3,833,894 | 9/1974 | Aviram et al. | 357/8 |

*Primary Examiner*—William D. Larkins
*Attorney, Agent, or Firm*—Isidore Match; Hansel L. McGee

[57] ABSTRACT

There are described herein organic electronic devices of the acceptor-donor (A-D), acceptor-donor-acceptor (A-D-A), donor-acceptor-donor (D-A-D), acceptor-donor-acceptor-donor (A-D-A-D), types analogous to the p-n, p-n-p, n-p-n and p-n-p-n types in typical semiconductor devices. The A-D device suitably comprises a support or substrate upon which there is provided a layer of a conductive metal. On this metallic layer, there is provided in a thickness of about 25 to 50 Angstroms, a barrier layer organic compound. On the latter compound, there is provided a deposited metal conductor, the metal depositing suitably being effected by a technique such as vapor deposition. The A-D-A and D-A-D devices comprise a semiconductor or metallic body, on each surface of which there is provided in about a 25 to 50 Angstrom thickness, the aforementioned barrier layer compound. On each compound layer there is deposited a metal conductor. The barrier layer compound suitably is one whose molecules consist of two nonsymmetric, i.e., not same energy level, reversible redox portions separated by a tunneling bridge.

5 Claims, 9 Drawing Figures

FIG. 1
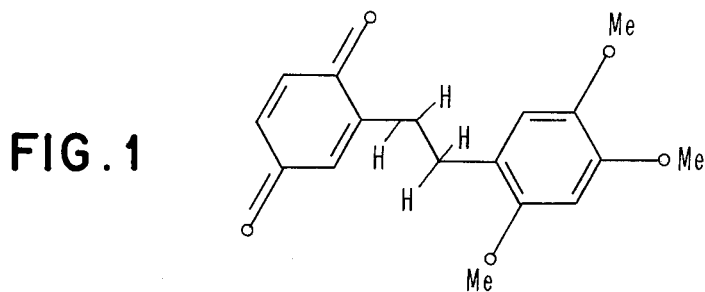
ENERGY LEVELS OF $\pi$ SYSTEMS IN eV
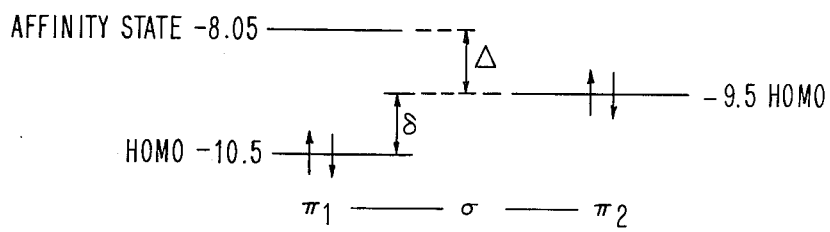
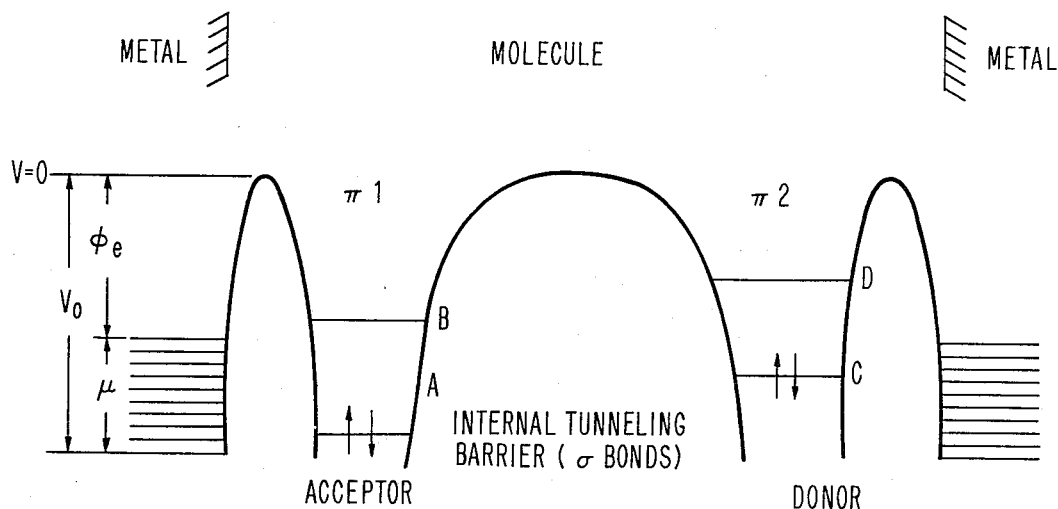
FIG. 2

RATES: $\frac{1}{R_T} = \frac{1}{R_A} + \frac{1}{R_B} + \frac{1}{R_C}$

I vs V for Aℓ/ARACHIDIC ACID/Hg

ORGANIC ELECTRONIC RECTIFYING DEVICES

BACKGROUND OF THE INVENTION

This invention relates to barrier layer devices. More particularly, it relates to novel barrier layer devices employing materials whose molecules have the property of an A-D junction. A known example of such barrier layer compound is a hemiquinone which is a compound that contains a stabilized hydroquinone of low ionization potential and a quinone of high electron affinity in the same vicinity. Such molecule acquires the properties of a p-n junction. The high energy portion of the hemiquinone which has an excess of electrons acts as an n-type material and its high affinity portion which has a deficiency of electrons acts as a p-type material.

It is an important object of this invention to provide organic electronic devices employing compounds having higher and lower energy levels to provide the barrier layer therefor.

It is another object of this invention to provide organic electronic devices in accordance with the preceding object which are of the A-D diode type, of the A-D-A and D-A-D transistor type, and of the A-D-A-D and D-A-D-A types.

SUMMARY OF THE INVENTION

In accordance with the invention, there is provided an A-D device. This device comprises a substrate upon whose surface, there is provided a layer of a metallic conductor, such conductor suitably being copper, aluminum, tin and the like. On this metallic layer, there is laid down a barrier layer compound made up of molecules which consist of two nonsymmetric (different energy level) reversible redox portions separated by a tunneling bridge, such laying down suitably being effected by the techniques as disclosed in the publications of Rayleigh, Proc. Roy. Soc. A47, 364 (1890), K. H. Drexhage, Sci. Amer. 70A, 611–801 (March 1970) and Langmuir I. Journal of American Chemical Society, 39, 541, 1917.

The barrier layer compound is provided in a layer having a thickness of about 25 to 50 Angstroms. On this layer there is deposited, suitably by vapor deposition, a layer of a conductive metal which may also be of copper, aluminum, tin or the like. The metal on the substrate and the deposited metal need not be the same. For the device to function as a diode, electrical contacts are made to each metal layer.

Also in accordance with the invention there are provided D-A-D and A-D-A devices. In the providing of such devices, a semiconductor or metallic body has laid down on each of its opposite surfaces the barrier layer compound in a 25 to 50 Angstrom thickness. On each of the compound layers, there is deposited a conductive metal layer.

Examples of the barrier layer compound are the following types of hemiquinone structures:

A. 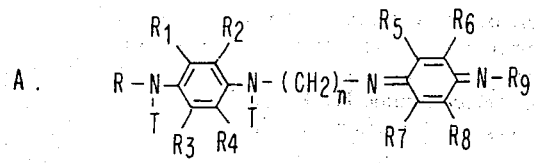

B. 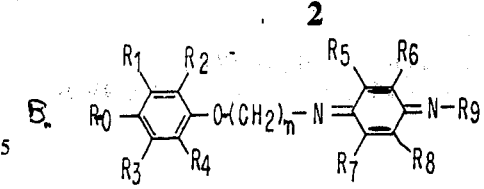

C. 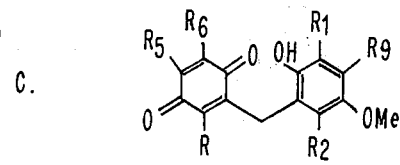

D. Structures such as A and B wherein one or all of $R_1$, $R_2$, $R_3$ and $R_4$ are substituents in one of the phenyl rings and one or all of $R_5$, $R_6$, $R_7$ and $R_8$ are constituents on the other phenyl ring.

E. Structures such as A, B, C and D wherein R and $R_9$ are interchanged.

In compounds A, B, C, D and E, R is suitably selected from the group consisting of $C_xH_{2x+1}$, $C_xH_y$ chains containing double bonds and

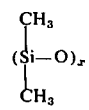

wherein $x = 10$ to $30$ and the value of $y$ depends upon the number of double bonds; $R_1$, $R_2$, $R_3$ and $R_4$ are each suitably selected from the group consisting of H, $CH_3$, $OCH_3$, $OC_2H_5$, phenyl, $-N(CH_3)_2$, $-N(C_2H_5)_2$, $SCH_3$ and $OCOCH_3$; $R_5$, $R_6$, $R_7$ and $R_8$ are each suitably selected from the group consisting of H, F, Cl, Br, I, $CF_3$, CN, $NO_2$ and $-COOCH_3$; and $R_9$ is suitably selected from the group consisting of $CH_2COOH$, $CH_2NH_2$, and $CH_2N^+(CH_3)_3$—halogen$^-$; T is suitably selected from the group consisting of H, $CH_3$ and $C_2H_5$; and $n = 1$ to $10$.

Other examples of the barrier layer compound are the following compounds, which are characterized in consisting of two nonsymmetric, i.e., not the same energy level, reversible redox portions separated by a tunneling bridge:

F. 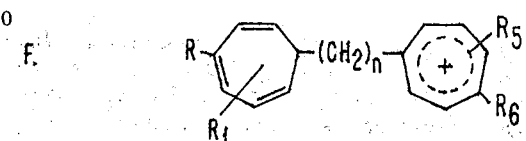

G. 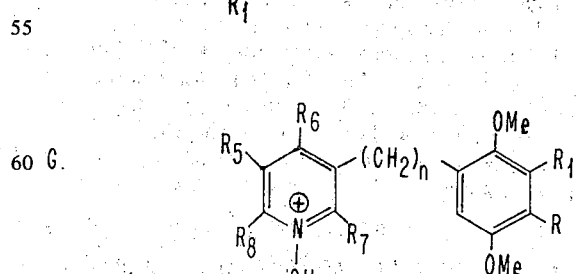

H. ($M_1$ chelate) — $(CH_2)_n$ — ($M_2$ chelate) wherein M is a metal and $M_1$ is different from $M_2$; and $n = 1$ to

10.

Examples of compound H are $\pi RCp_2Ni(CH_2)_n - \pi R_9Cp_2TiCl_2$ and $\pi RCp_2Fe(CH_2)_n - \pi_{R9}CP_2TiCl_2$ wherein Cp =

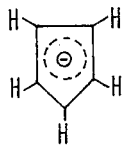

I.

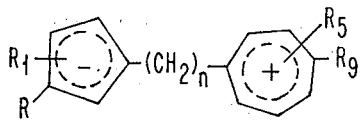

J.

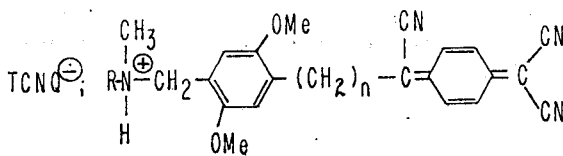

K. The TCNQ complex

TCNQ⊖; R–N⊕(CH₃)–CH₂–[benzene with OMe,OMe]–(CH₂)ₙ–C(CN)=[quinoid]=C(CN)(CN)
         |
         H TCNQ is 7, 7, 8, 8 - tetracyanoquinodimethan. The compound TCNQ is known and is disclosed in the publication of D. J. Acker and W. R. Hertler, "Substituted Quinodimethans. 1. Preparation and Chemistry of 7, 7, 8, 8 - Tetracyanoquinodimethan," Journal of the American Chemical Society, 84, p. 3370 (1962).

The foregoing and other objects, features and advantages of the invention will be apparent from the following more particular description of the preferred embodiment of the invention, as illustrated in the accompanying drawings.

PRIOR ART

U.S. Pat. No. 3,403,165 to Yoshio Matsunaga for "Tetrathiotetracene Ion-Radical Salt," issued September 24, 1968, discloses an organic semiconductive composition having the formula $[D]_m [A]_n$, in which A is selected from the group consisting of o- and p- benzoquinones having at least two electronegative substituents thereon and wherein D is tetrathiotetracene, and wherein $m$ and $n$ are positive integers of 3 and less. The electronegative groups can be groups such as halogen, nitro, carboxy and the like. It is indicated in the patent that this composition is useful in solid state semiconductor devices such as transistors, thermistors, rectifiers, diodes, photocells, photoconductors, radiation detectors, thermocouples, thermoelectric generators, Peltier cooling cells, among others.

U.S. Pat. No. 3,341,367 to Fritz-Werner Beyerlern for "Method for Treating the Surface of Semiconductor Devices," issued Sept. 12, 1967, discloses the treatment of p-n junctions with certain quinone derivatives such as 1,2-dehydroxyanthiaquinone to improve reverse current stability.

U.S. Pat. No. 3,379,742 to Yoshio Matsunaga for "Process for Preparing Transformed 1:1 Complex of 1,6-Diaminopyrene-p-Chloranil," issued Apr. 23, 1968, discloses an organic semiconducting complex derived from a high sensitivity 1,6-diaminopyrene-p-chloranil complex. This complex is stated to posses the enhanced property of low resistance and to find particular utility in solid state semiconductor devices.

Although the foregoing patents disclose organic semiconductor materials, none of them anticipate the compounds and the beneficial results achieved by their use as barrier layers to constitute semiconductor devices according to the invention as is further described hereinbelow.

BRIEF DESCRIPTION OF THE DRAWINGS

In the drawings, FIG. 1 illustrates the energy levels in $\pi_1 - \sigma - \pi_2$ electronic system wherein $\sigma$ represents a tunneling barrier, there being shown a hemiquinone representative of such system;

FIG. 2 illustrates the energy levels of the hemiquinone shown in FIG. 1 when it is placed between two metals and with no voltage applied thereto;

DESCRIPTION OF PREFERRED EMBODIMENTS

In considering the principles upon which the invention described herein are based, there are first considered the properties of barrier layer organic compounds, a salient example of such compounds being hemiquinones.

A hemiquinone molecule conveniently can be characterized as a compound which is constituted by two $\pi$ electronic systems separated by a $\sigma$ bonded tunneling bridge, i.e., $\pi$-$\sigma$-$\pi$. In these two electronic systems, the pertinent electronic levels are the affinity or acceptor states of each $\pi$ system and the ground or donor states of each π system. In FIG. 1 there is illustrated a hemiquinone and the energy levels of one π system therein in eV.

In FIG. 2, there is illustrated the energy levels of the hemiquinone when it is placed between two metals and wherein no external field is applied. In this FIG., it is seen that molecular energy levels below the Fermi energy level of the metals are full while those levels above the Fermi level are empty.

Figure 3:
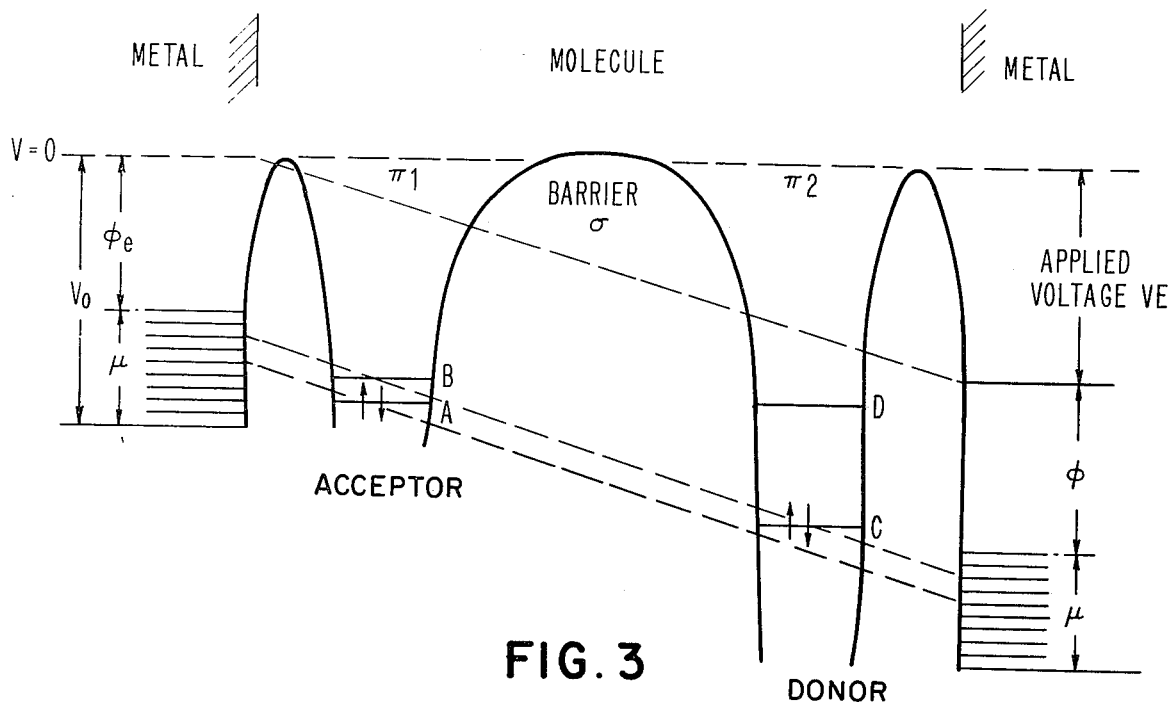
FIG. 3 illustrates the system shown in FIG. 2 but with a voltage applied thereto.

FIG. 3 illustrates the situation which obtains when an external voltage, VE is applied. In this situation, level B has fallen below the Fermi level and is ready to accept an electron since electrons tunnel with conservation of energy into the empty state whereas level C has also declined but is located above the Fermi level at the right and is in a state to donate an electron for the same reason as explained in connection with electron acceptance.

Figure 4:
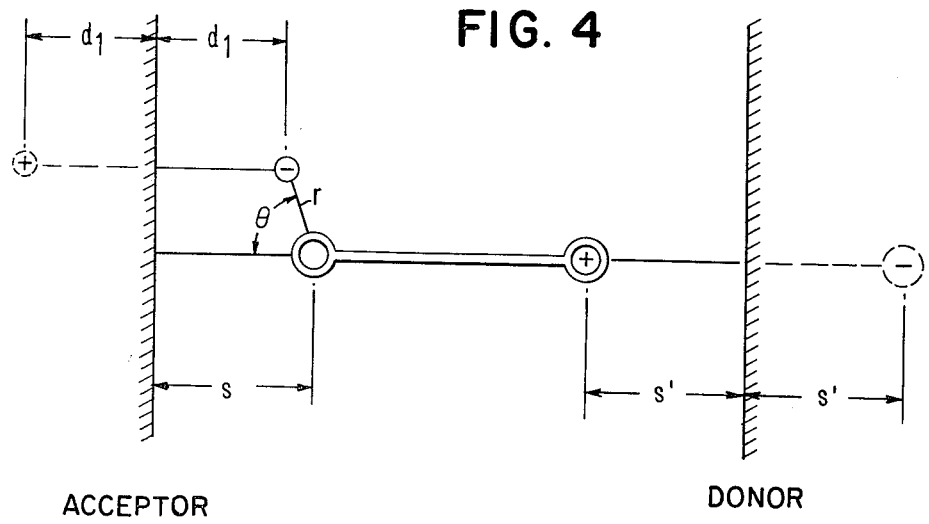
FIG. 4 is a depiction of the classical picture of the charged molecule and the image changes it induces in metals.

The result which ensues is shown in FIG. 4 which illustrates the classical picture of the charged molecule and the image charges it induces in the metals. FIG. 4 implies that there will follow an internal tunneling from levels B → C regenerating the uncharged molecule and a net transfer of one electron from left to right would occur.

When the polarity of the applied field is reversed, level "A" becomes the donor and level "D" becomes the acceptor. It can readily be appreciated that in order for the conditions for charge transfer metal → level "D", level "A" → metal, to be met, a much higher applied voltage will be required as compared to the applied voltage for the forward case.

Continuing the consideration of the reverse case through the levels "B", "C". when level "C" transfers an electron to level "B," conduction proceeds as follows: level "B" → metal; metal → level C. Such conduction cannot occur as long as level "B" is higher relative to level "C." Thus, overall rectification of current occurs.

The equations for quantitatively calculating rates for transitions from atom to metal are set forth hereinbelow:

Rates for Transitions from Atom to Metal $$R = \sum_{\substack{deg \\ spin}} \frac{2\pi}{\hbar} \rho_k |T_{i,f}|^2$$

Density of States in the Metal $$\rho_k = \frac{mk}{8\pi^3\hbar^2} \text{ per unit solid angle}$$

$$R = \frac{L^3 m |K_0|}{2\pi^2\hbar^3} \int_o^{2\pi} d\phi \int_o^{\frac{1}{2}\pi} \sin\theta |T_{i,f}|^2 d\theta$$

With the above equations (the "golden rule"), $|T_{i,f}|$ is calculated by $T_{i,f} = <M|(1/r) - e\epsilon z|2p\pi>$ where M represents metallic wave functions, the term $2p\pi$ represents Slater atomic orbitals, e represents electronic change, $\epsilon$ represents electric field, and z represents the z component of Cartesian coordinates.

There follow hereinbelow the equations for metal electron wave functions and Slater atomic orbitals:

METAL ELECTRON WAVE FUNCTIONS

A free N-electron metal is assumed. Thus, the total anti-symmetric electron state is defined by $$|M> = (N!)^{-1/2} \sum_p (-1)^P P\{u_1(r_1)u_2(r_2)\ldots u_n(r_h)\},$$

where P is the usual permutation operator, the sum is over all permutations and $u_j(r)$ is the single free-electron eigenfunction with kinetic energy $E_j$ such that $0 \leq E_j \leq \mu + \phi_e$ for a bound electron, with $\mu =$ the Fermi energy and $\phi_e =$ the electron work function. Because of spin degeneracy, at zero temperature the energy levels are filled only up to $\mu$. For the assumed free electron metal, the single electron wave functions are $$u_j = (1k_v L^{3/2})e^{i(k_{01j}x + k_{02j}y)}\{(k'_{03j}+k_{03j})e^{ik'_{03j}\xi} + (k'_{03j}-k_{03j})e^{-ik'_{03j}\xi}\} \text{ for } \xi<0,$$

$$u_j = (1/k_v L^{3/2})e^{i(k_{01j}x + k_{02j}y)} 2k'_{03j}e^{ik_{03j}\xi} \text{ for } \xi>0.$$

In the $u_j$'s the following nomenclature has been adapted:

$$V_0 = \mu + \phi_e = \hbar^2 k_v^2/2m$$

$$K_{0j}^2 = k_{01j}^2 + k_{02j}^2 + k_{03j}^2$$

$$k'_{03j}{}^2 = k_{03j}^2 + k_v^2$$

$$k'_{0j}{}^2 = k_{0j}^2 + k_v^2$$

L is the length of the large but finite cubic metal. The indices 1, 2 denote the x, y directions on the plane of the surface and 3 denotes the z or $\xi$ direction that is normal to the surface and positive outside the metal. Primes above the k indicate that the energy is measured from the bottom of the well. The subscript 0 stands for a bound metallic state. Note also that $k_{0j}$ and $k_{03j}$ are both positive imaginary numbers. Low-lying levels below the conduction band are ignored.

Slater Atomic Orbitals $$|2s> = \left(\frac{\alpha^5}{\pi}\right)^{1/2} re^{-\alpha r}$$

$$|2p\sigma> = \left(\frac{\alpha^5}{\pi}\right)^{1/2} re^{-\alpha r}\cos\theta$$

$$|2p\pi> = \left(\frac{\alpha^5}{\pi}\right)^{1/2} re^{-\alpha r}\sin\theta \cos\phi$$

where $a$ is an atomic number and $r\theta$ and $\phi$ are spherical coordinates.

An example of the calculation of a rate is as follows:

Example of Rate from 2 π Atomic Orbital to Metal $$R_A \text{ or } R_C = c^r \left\{ \frac{4m\alpha^3 q^4 k_{03}'^2}{\hbar^3 k_v^2 k_o S^2} \left[\frac{1}{\alpha} + S\alpha^2 e^{-2S}\right] - \frac{4m\alpha^9 k_{03}'^2 q^2 \epsilon^2 e^{-S\alpha}}{\hbar^3 k_v^2 |k_0| S^4} \left[\frac{3}{2} - \frac{S^2}{\alpha^5} + \frac{S^3}{\alpha^4} + \frac{S^4}{4\alpha^3}\right]^2 \right\}$$

where q is the electron charge,
S the distance of the orbital from the metal wall,
and c the coefficient in the molecular orbital.

In the above connection, reference is also made to J. W. Gadzuk, Surface Science 6, page 133 (1966). All symbols have the same significance as in this reference.

The internal tunneling is slightly different and is given by the equation:

$$R_B = \frac{2\pi_2}{\hbar} \sqrt{E_{donor}} (E_{hemiquinone} - E_{left} \phi)$$

Figure 5:
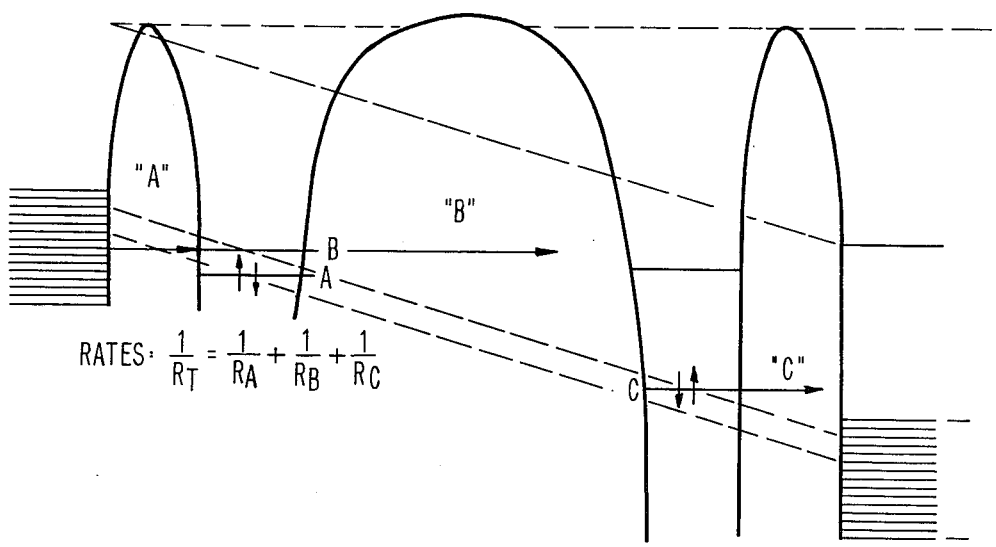
FIG. 5 illustrates three noncoherent tunneling processes and their rates.

The rates are added as shown in FIG. 5 wherein there are depicted three non-coherent tunneling process rates, i.e., $$\frac{1}{R_T} = \frac{1}{R_A} + \frac{1}{R_B} + \frac{1}{R_C}$$

In the equation immediately hereinabove, $R_T$ represents the rates of tunneling through the electronic leads of the organic molecule and is termed "assisted tunneling." In addition to such assisted tunneling, there exists an additional mechanism of electron tunneling from metal electrode to metal electrode which does not involve organic molecular states and which is termed direct tunneling. The assisted and direct tunneling mechanisms occur simultaneously.

Direct tunneling does not result in rectification and, consequently, rectification is observed only if the assisted tunneling mechanism dominates.

Figure 6A:
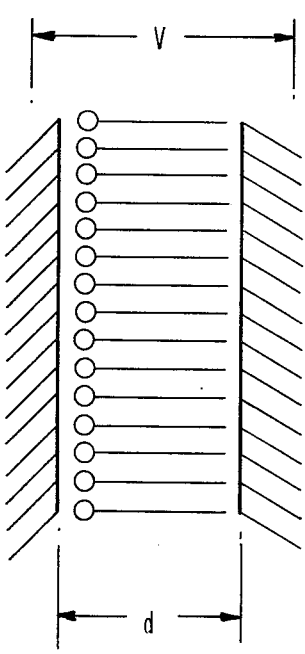
FIG. 6A depicts an embodiment of a tunnel junction of simple fatty acid salt monolayers.
Figure 6B:
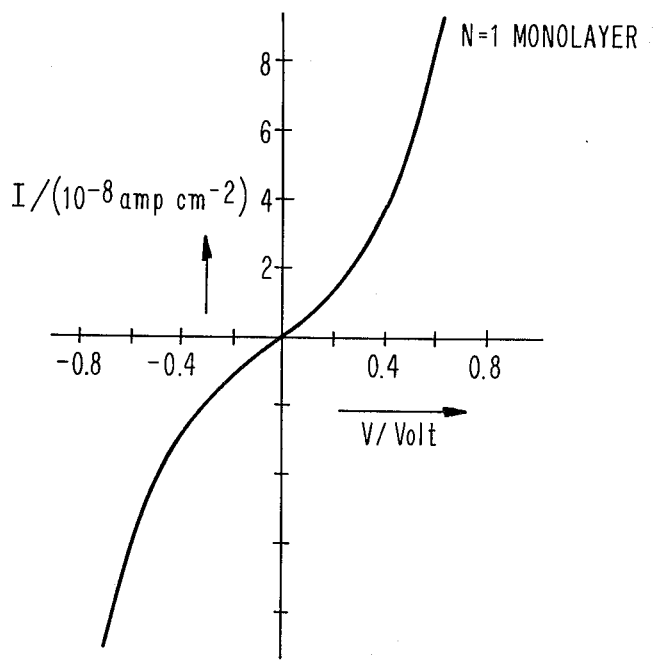
FIG. 6B shows its I.V. characteristics.

In this latter connection, FIG. 6A schematically depicts an organic molecule sandwiched between two metallic electrodes. In FIG. 6B, there is shown the tunneling current which results using the sandwich shown in FIG. 6A. Such tunneling is described in the publication of B. Mann and H. Kuhn, Journal of Applied Physics, 42, p. 4398 (1970).

It has been ascertained by means of calculations that assisted tunneling exceeds direct tunneling by five orders of magnitude utilizing a molecule such as that shown in FIG. 1 whereby rectification could be observed therewith.

An oriented monolayer of molecules such as the following molecule can be obtained if the end groups are chosen such that one end is hydrophobic and the other is hydrophilic.

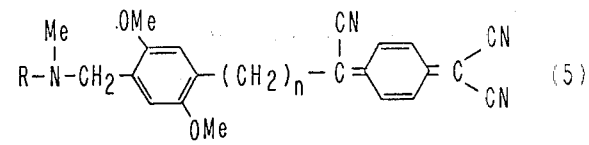

Examples of such choice are the following:
$R = C_nH_{2n+1}$ wherein $n$ is about 10 to 30 or $C_{2n}H_{2n+1}$ wherein $n$ is about 5 to 15 or combinations thereof;
$R_9 = CH_2COOH$, $CO—COOH$, and $CH_2—N^+R_4^2$ wherein $T = CH_3$, or $C_2H_5$.
Unsaturation in the side chain R is desirable since it provides a means for electrical conduction (low potential tunneling barrier) between the hemiquinone molecules in subsequent strata.

When two layers of molecules such as molecule (1) are deposited on a metal surface, the result is a symmetrical layer. The symmetry results from the fact that the layers form a tail-to-tail and head-to-head arrangement.

To form asymmetric D-A structures, there can be alternately deposited molecules such as (2) and (3), as shown directly hereinbelow. Molecules (2) and (3) differ from each other in the interchange of the end-groups

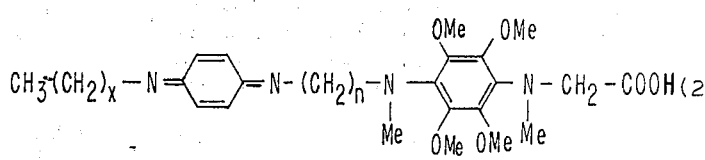

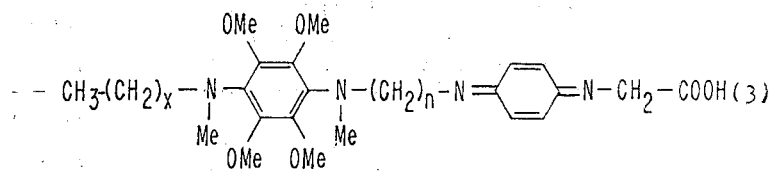

wherein $x$ suitably has a value of 10 to 30. By such alternate deposition, multilayers can be formed which have the sequence D-A-D-A-D-A.

Utilizing a tail such as structure (4) depicted hereinbelow, $$CH_3(CH=CH)_y \text{ wherein } y = 5 \text{ to } 15 \qquad (4)$$

there can be obtained the same D-A-D-A-D-A... structure when molecule (4) is either used with molecule (2) or molecule (3). In this situation, tail (4) functions as a conductor.

To effect conduction from molecule to molecule, in addition to the tunneling or the $\pi$ orbital overlap in the unsaturated chains, there can also be utilized $\pi$ complexes of the type TCNQ, i.e., 7, 8, 8-tricyanoquinodimethan to

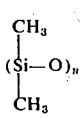

wherein $n = 1$ to 10 and $R = C_nH_{2n+1}$, $C_nH_y$ chains containing double bonds and $$(\overset{CH_3}{\underset{CH_3}{Si-O}})_n$$

wherein $n = 10$ to 30 and $y$ is determined by the number of double bonds.

The addition of one equivalent of TCNQ to molecule (5) yields the following molecular complex which meets all of the requirements for conducting junctions

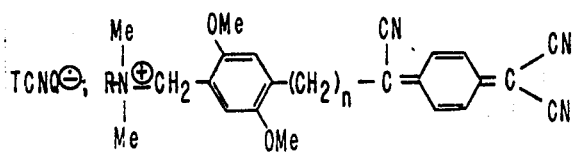

To summarize the foregoing, and to provide examples of compounds which can function as molecular diodes, according to the invention, the following types of chemical structures are presented:

1.)

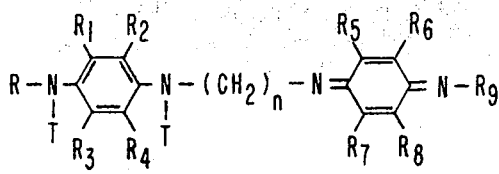

wherein $n = 1$ to 10; wherein $R_5$, $R_6$, $R_7$ and $R_8$ are selected from the group consisting of H, F, Cl, Br, $I_1$, $CF_3$, CN, $NO_2$ and COOMe; wherein $R_1$, $R_2$, $R_3$ and $R_4$ are selected from the group consisting of H, Me, OMe, OEt, phenyl, $N_{Me}{}^{Me}$,

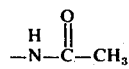

SMe and OCOOMe; wherein R is selected from the group consisting of $C_xH_{2x+1}$; $C_xH_y$ chains containing double bonds wherein $x = 10$ to 30 and $y$ is determined by the number of double bonds and

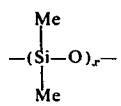

wherein $x = 10$ to 30, wherein $R_9$ is selected from the group consisting of $-CH_2-COOH$, $-CH_2-NH_2$, $-CH_2-N^+(CH_3)_3$ — halogen; and wherein T is selected from the group consisting of H, Me and Et.

2.)

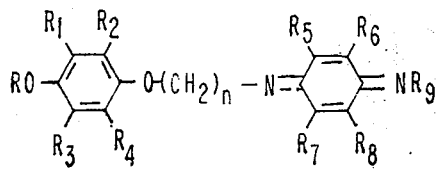

wherein $n$, and R, $R_1$, $R_2$, $R_3$, $R_4$, $R_5$, $R_6$, $R_7$, $R_8$ and $R_9$ have the same significance as they have in structure 1.

3. Structures having structural formulae such as depicted above in compounds (1) and (2) wherein one pair or all of the pairs $R_1$ and $R_2$, $R_3$ and $R_4$, $R_5$ and $R_6$, and $R_7$ and $R_8$ are substituents on the phenyl rings.

4.)

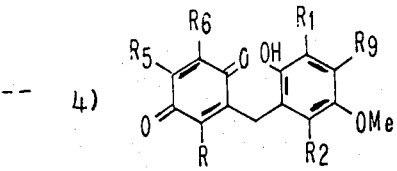

wherein R, $R_1$, $R_2$, $R_5$, $R_6$, and $R_9$ have the same respective significance as they have in structures (1), (2) and (3).

5. Structures (1), (2), (3) and (4) wherein the positions of R and $R_9$ are interchanged In addition, according to the invention, there are provided further examples of compounds that can function as molecular diodes, such compounds being constituted by molecules which consist of two nonsymmetric, i.e., different energy level, reversible redox portions separated by a tunneling bridge. Examples of such compounds are the following:

6.

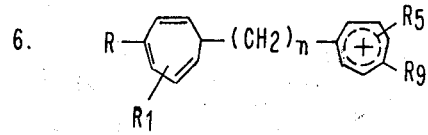

wherein R, $R_1$, $R_5$ and $n$ and $x$ have their previous significance as detailed in connection with structures (1) to (5).

7.

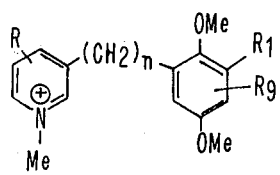

wherein R, $R_1$, $R_9$ and $n$ have their previous significance as detailed in connection with structures (1) to (6).

8. ($M_1$ chelate) — $(CH_2)_x$ — ($M_2$ chelate) wherein M is a metal and $M_1$ and $M_2$ are different metals.

Examples of structure (8) are a. $\pi RCp_2Ni(CH_2)_n$ - $\pi R_9Cp_2TiCl_2$
b. $\pi RCp_2Fe(CH_2)_n$ - $\pi R_9Cp_2TiCl_2$ wherein R and $R_9$ have their previous significance as detailed in connection with structures (1) to (7) and $n = 1$ to 10, and

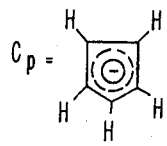

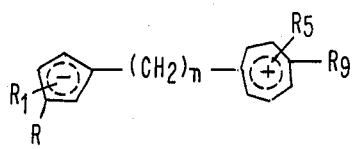

wherein R, $R_1$, $R_5$ and $R_9$ have their previous significance as detailed in connection with structures (1) to (8) and $n = 1$ to 10

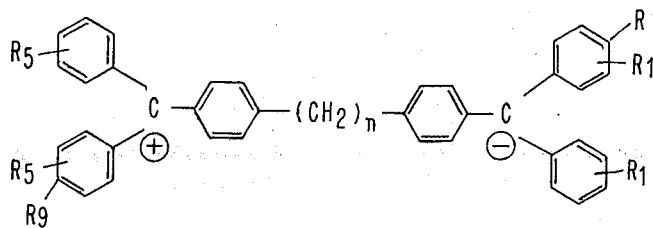

wherein R, $R_1$, $R_5$ and $R_9$ have their previous significance as detailed in connection with structures (1) to (9) and $n = 1$ to 10.

wherein R has its previous significance as detailed in connection with strucures (1) to (10) and $n = 1$ to 10.

According to the invention, the following structures can be employed as $\sigma$ bridges, donor and acceptor portions, respectively, of the barrier layer compound.

1.  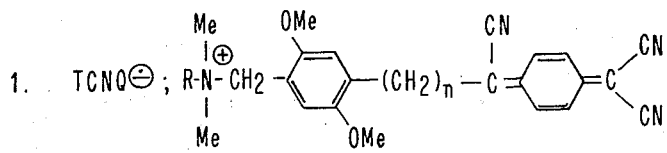

Structures Utilizable as $\sigma$ Bridge Portions

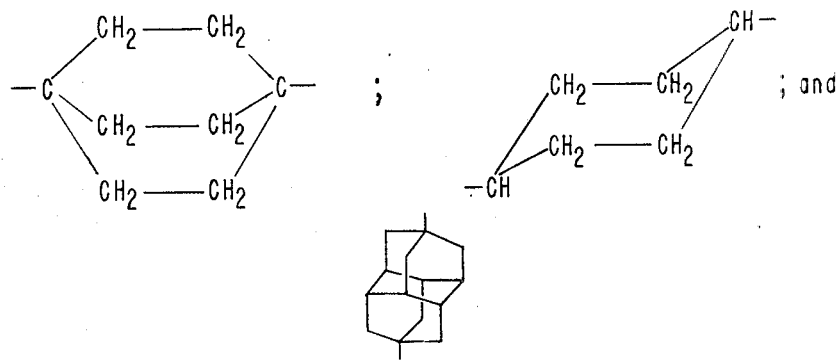

Structures Utilizable as Donors

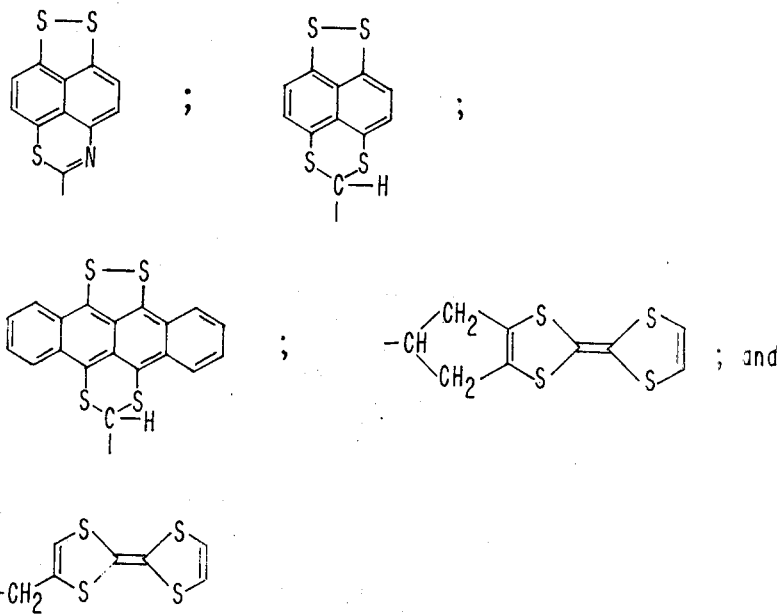

Structures Utilizable as Acceptors

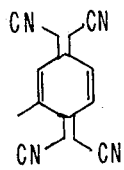 ; 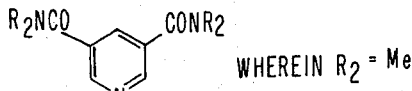 WHEREIN $R_2$ = Me

AND 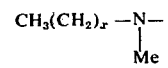

Figure 7:
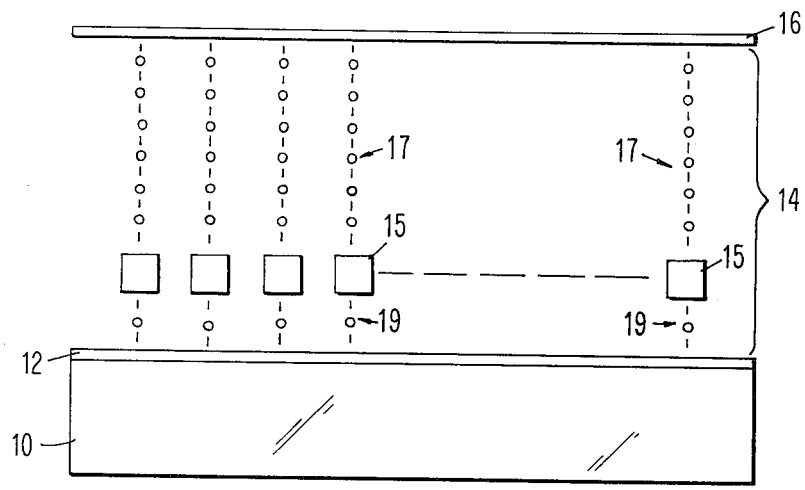
FIG. 7 is a depiction, partly in section, and partly schematic, of a preferred embodiment of an A-D device constructed according to the invention.

In FIG. 7, there is depicted an A-D device constructed in accordance with the principles of the invention. In the fabrication of this device, there is deposited on a substrate support 10, which may suitably be of plastic, glass or the like, a conductive metal layer 12 such as copper, aluminum, tin, silver, etc. On metal layer 12, there is provided a barrier layer compound 14 as has been described hereinabove, i.e., one which is constituted of molecules that consist of two nonsymmetric (different energy level) reversible redox portions separated by a tunneling bridge. The laying down of the barrier layer compound is suitably effected by the technique as disclosed in the publication of Rayleigh, Proc. Royal Soc. A47, 364 (1890), V. H. Drexhage, Sci. Amer. 70A, 611–801, (March 1970) and I. Langmuir, Journal of the American Chemical Society 34, 541, 1917. The barrier layer compound is suitably laid down in a thickness of about 25 to 50 Angstroms and may be the following compound not be of the same metal. The deposited metals 12 and 16 can be laid down by a suitable deposition technique such as vapor deposition and may suitably have a thickness of about 200 to 1000 A.

Figure 8:
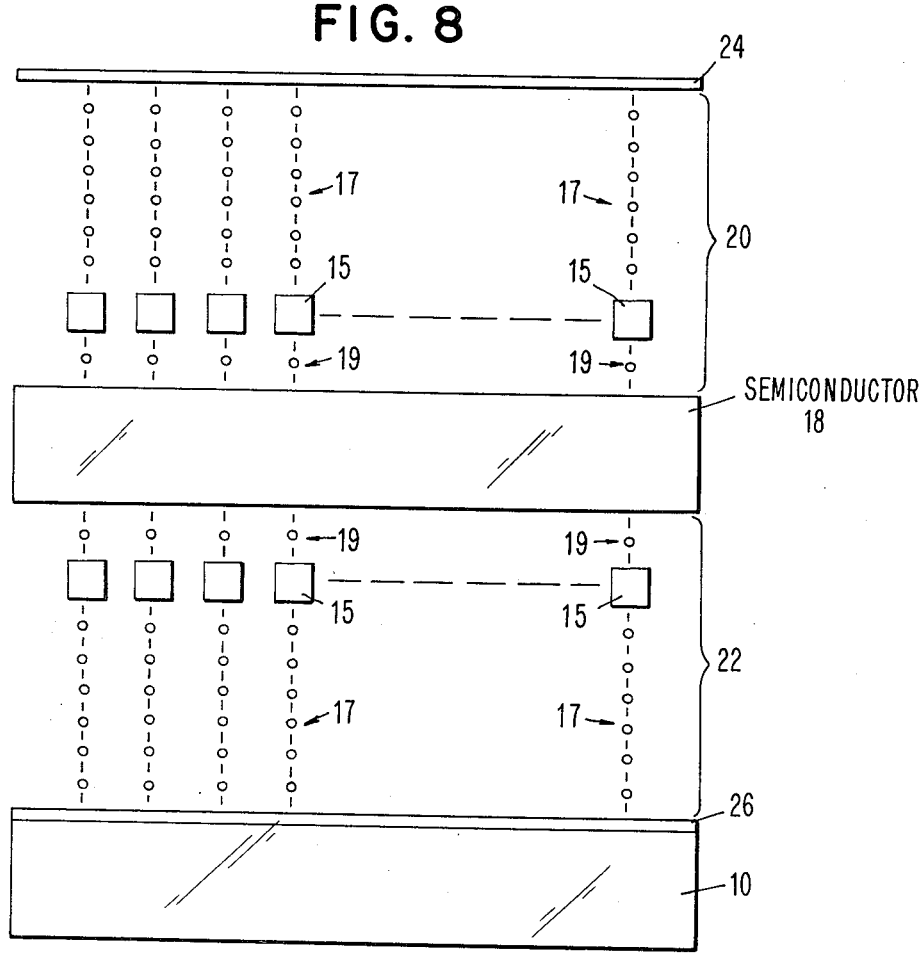
FIG. 8 is a depiction similar to that of FIG. 7 and which illustrates a preferred embodiment of an A-D-A device constructed according to the invention.

To provide an A-D-A structure according to the invention, an arrangement such as shown in FIG. 8 may be employed. In this structure, there is provided a semiconductor or metallic body 18. On each surface of body 18, there is laid down in about 25 to 50 Angstroms thickness a layer of a barrier layer compound which may suitably be the compound described hereinabove in connection with the device of FIG. 7, these layers respectively bearing the designating numerals 20 and 22. On layers 20 and 22, there are deposited metal layers 24 and 26, respectively, metal layers 24 and 26 being of the same nature and thickness as deposited metal layer 16 in the structure depicted in FIG. 7.

To provide a D-A-D structure, barrier layers 20 and 22 may suitably be of the following compound

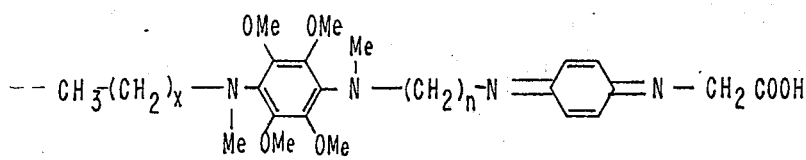

In this situation, portion 17 is the $)_x$

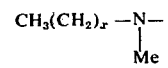

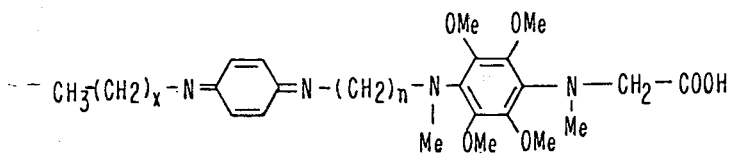

wherein $x$ = 10 to 30.

Layer 14 is shown in exaggerated thickness to illustrate the deposition of the molecules therein. Each molecule is shown as comprising a higher and lower energy redox portion symbolized by a box 15, the side chain $CH_3(CH_2)_x$ is designated with the numeral 17 and the portion — N — $CH_2$ — COOH is designated with the numeral 19.

On barrier layer 14, there is provided a layer 16 of a deposited conductive metal which is also suitably selected from such metals as copper, aluminum, tin, silver, and the like. However, metal layers 12 and 16 need side chain and numeral 19 designates the portion = N — $CH_2$ — COOH. The metal layers 24 and 26 can be similar to layers 24 and 26 (FIG. 8).

For the device of FIG. 7 to function as a diode, electrical contacts are made to metal layers 12 and 16. For the device of FIG. 8 to function as a transistor, electrical contacts are made to metal layers 24 and 26 and semiconductor or metallic body 18.

While the invention has been particularly shown and disclosed with reference to preferred embodiments thereof, it will be understood by those skilled in the art, that various changes in form and details may be made therein without departing from the spirit and scope of the invention.

What is claimed is:

1. An organic electronic device comprising:
   a substrate;
   a first conductive metal layer on said substrate adapted to have an electrical contact made thereto;
   a layer of a compound on said first metal layer selected from the group consisting of:

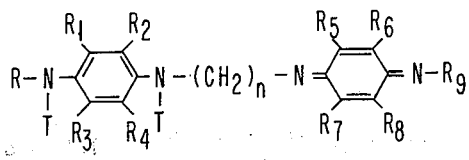

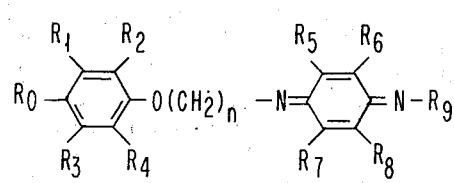

wherein any or all or the pairs, $R_1$ and $R_2$, $R_3$ and $R_4$, $R_5$ and $R_6$, and $R_7$ and $R_8$ are substituents on the phenyl rings and where T is selected from the group consisting of H, $CH_3$ and $C_2H_5$.

2. An organic electronic device comprising:
   a first layer of a conductive metal adapted to have electrical contacts applied thereto;
   a second layer on said first layer of a compound having the structure

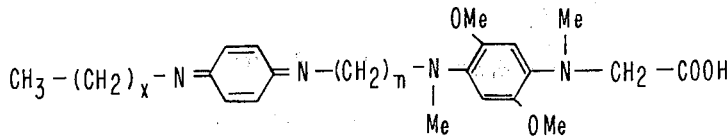

a third layer of a deposited conductive metal on said second layer, and adapted to have electrical contacts made thereto.

3. An organic electronic device comprising:
   a first layer of a conductive metal adapted to have electrical contacts made thereto;
   a second layer on said first layer of a compound having the structure $CH_3(CH_2)_x - N\text{-}\!\!\!=\!\!\!\begin{pmatrix}OMe\\ \\Me\end{pmatrix}\!\!\!=\!\!\!N-(CH_2)_n N\!\!\!=\!\!\!\langle\rangle\!\!\!=\!\!\!N-CH_2-COOH$ ;

wherein $x=10$ to 30; and
a third layer of a deposited metal on said second layer, and adapted to have electrical contacts made thereto.

4. An organic electronic device comprising:
   a body having a pair of opposite surfaces and selected from the group consisting of semiconductors and metals;
   respective layers on said opposite surfaces of said body of a compound having the structure , and

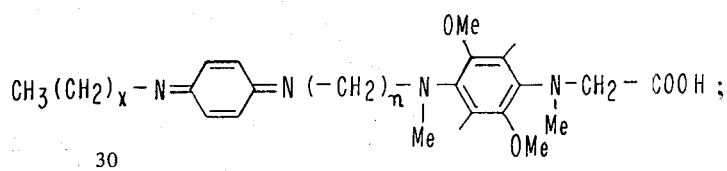

wherein $x = 10$ to 30 and $n = 1$ to 10; and
a layer of a deposited metal on each of said compound layers, said metal layers and said body being adapted to have electrical contacts made thereto.

5. An organic electronic device comprising:
   a body having a pair of opposite surfaces and selected from the group consisting of semiconductors and metals;
   respective layers on said opposite surface of said body of a compound having the structure

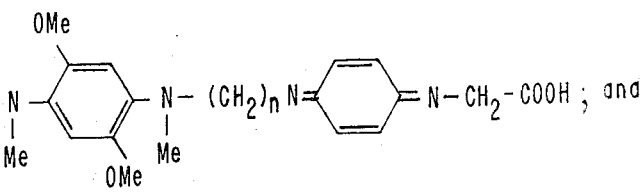

wherein $x = 10$ to 30 and $n = 1$ to 10; and
a layer of a deposited metal on each of said compound layers, said metal layers and said body being adapted to have electrical contacts made thereto.

* * * * *